US Patent number 4,901,201, Crowe, Feb. 13, 1990.

United States Patent [19]
Crowe

[11] Patent Number: 4,901,201
[45] Date of Patent: Feb. 13, 1990

[54] PLATE FIN/CHIC HEAT EXCHANGER

[75] Inventor: Lawrence E. Crowe, Lindenwood, Ill.

[73] Assignee: Sundstrand Corporation, Rockford, Ill.

[21] Appl. No.: 261,992

[22] Filed: Oct. 25, 1988

[51] Int. Cl.$^4$ .............................................. H01L 23/46
[52] U.S. Cl. ..................................... 361/384; 361/386
[58] Field of Search .............................. 361/384, 386

[56] References Cited

U.S. PATENT DOCUMENTS

| | | | |
|---|---|---|---|
| 4,103,737 | 8/1978 | Perkins | 361/384 X |
| 4,347,897 | 9/1982 | Sumitomo et al. | |
| 4,494,171 | 1/1985 | Bland et al. | |
| 4,498,118 | 2/1985 | Bell | 361/384 |
| 4,644,443 | 2/1987 | Swensen et al. | |
| 4,691,274 | 9/1987 | Matouk et al. | 361/384 X |

Primary Examiner—Roy N. Envall, Jr.
Attorney, Agent, or Firm—Antonelli, Terry & Wands

[57] ABSTRACT

Electrical devices which generate different amounts of heat are selectively cooled with a heat exchanger having a first portion formed of a fin-type heat exchanger and a second portion formed of a compact high intensity cooler wherein a jet impingement cooling mechanism is employed. Cooling fluid is circulated through the respective cooling mechanisms which can be arranged in series or parallel for differentially cooling respective electrical devices placed in contact with respective portions of an outer surface of the heat exchanger.

20 Claims, 2 Drawing Sheets

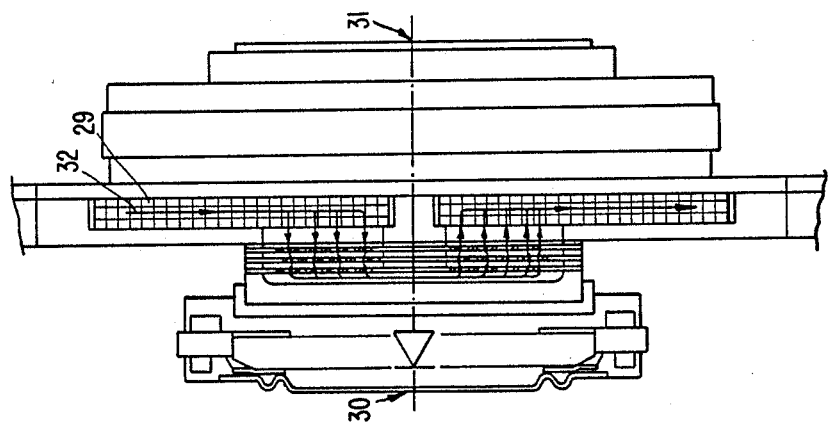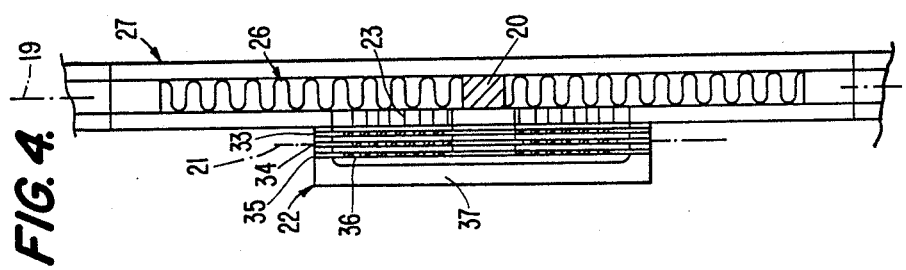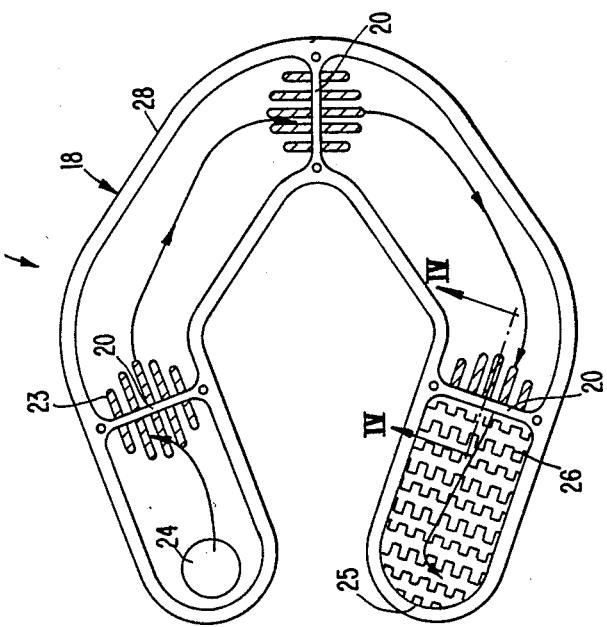

PLATE FIN/CHIC HEAT EXCHANGER

TECHNICAL FIELD

The present invention relates to a heat exchanger for cooling a plurality of heat generators at different rates. In particular, the invention is directed to an improved heat exchanger and an arrangement of electrical devices employing the same, which permit lower intensity cooling of electrical devices which do not require a very intensive heat removal, and more intensive cooling by means of a jet impingement cooling mechanism of electrical devices requiring more intensive heat removal.

BACKGROUND ART

In providing cooling for electrical devices such as electronic components and printed wiring boards, the problem of providing dedicated cooling of a high heat flux device located in the midst of other components requiring only minimal cooling is often encountered. An object of the present invention is to provide a heat exchanger which provides a solution to this problem.

U.S. Pat. No. 4,644,443 discloses a proposed solution to the problem of cooling both lower power-dissipating components and relatively higher power-dissipating electronic components in an electronic system. In this known computer cooling system using recycled coolant, cooling air is directed over the lower power-dissipating components and then the heated air is redirected over the higher power-dissipating electronic components.

Jet impingement cooling apparatus are, per se, known as shown in U.S. Pat. Nos. 4,494,171 and 4,347,897. In U.S. Pat. No. 4,494,171 the impingement cooling apparatus is in the form of a compact high intensity cooler, referred to by the acronym CHIC, for removing dissipated heat at high heat fluxes from a heat liberating device such as an electronic component. However, these known jet impingement cooling apparatus do not suggest a solution to the aforementioned problem of providing dedicated cooling of a high heat flux device located in the midst of other components requiring only minimal cooling.

DISCLOSURE OF INVENTION

The above and other objects of the present invention are attained by the heat exchanger of the invention which comprises, in a combined structure, both a jet impingement cooling mechanism for high intensity cooling and a non-jet impingement cooling mechanism for low intensity cooling.

More particularly, a heat exchanger according to the present invention comprises thermally conductive means defining a channel having an inlet for receiving a cooling fluid and an outlet for discharging the cooling fluid to which heat has been transferred. The channel has at least two portions. One of the portions has disposed therein a jet impingement cooling mechanism and another of the portions of the channel has a non-jet impingement cooling mechanism located at the another portion of the channel for transferring heat in the non-jet impingement cooling mechanism to fluid flowing through the another portion of the channel.

A first heat generator such as an electrical device, for example an electronic component or a printed circuit board, is located in thermal contact with the means defining the channel adjacent the one portion of the channel. Heat flows from the first heat generator to the one portion to cool the first heat generator during operation of the first heat generator when cooling fluid is flowed through the channel. A second heat generator is located in thermal contact with the means defining the channel adjacent the another portion of the channel. As a result, heat flows from the second heat generator to the another portion to cool the second heat generator during operation of the second heat generator when cooling fluid is flowed through the channel. According to the disclosed, preferred embodiment of the invention, the heat exchanger is employed in an arrangement of electrical devices to selectively provide high intensity and low intensity cooling of respective electrical devices of the arrangement.

The non-jet impingement cooling mechanism is a fin-type heat exchanger in the disclosed embodiment. The fin-type heat exchanger is located in one plane. The jet impingement cooling mechanism is located out of the one plane. This jet impingement cooling mechanism is a compact high intensity cooler in the disclosed embodiment.

The first and second heat generators are in contact with respective portions of an outer surface of the combined structure defining the channel for the cooling fluid in the heat exchanger of the invention. The two portions of the channel can be located in series along the channel or in parallel, depending upon the desired cooling arrangement.

These and other objects, features and advantages of the present invention will become more apparent from the following description when taken in connection with the accompanying drawings, which show, for purposes of illustration only, several embodiments in accordance with the present invention.

BRIEF DESCRIPTION OF DRAWINGS

FIG. 3 is a cross-sectional view of a fin-type heat exchanger according to the third embodiment of the invention;

FIG. 4 is a cross-sectional view through the heat exchanger of FIG. 3 taken along the line IV—IV in FIG. 3; and FIG. 5 is a cross-sectional view similar to FIG. 4 illustrating a high heat dissipation device in contact with the compact high intensity cooler of the heat exchanger and a low power dissipation device in thermal contact with the fin-type heat exchanger.

BEST MODE FOR CARRY OUT THE INVENTION

Figure 1:
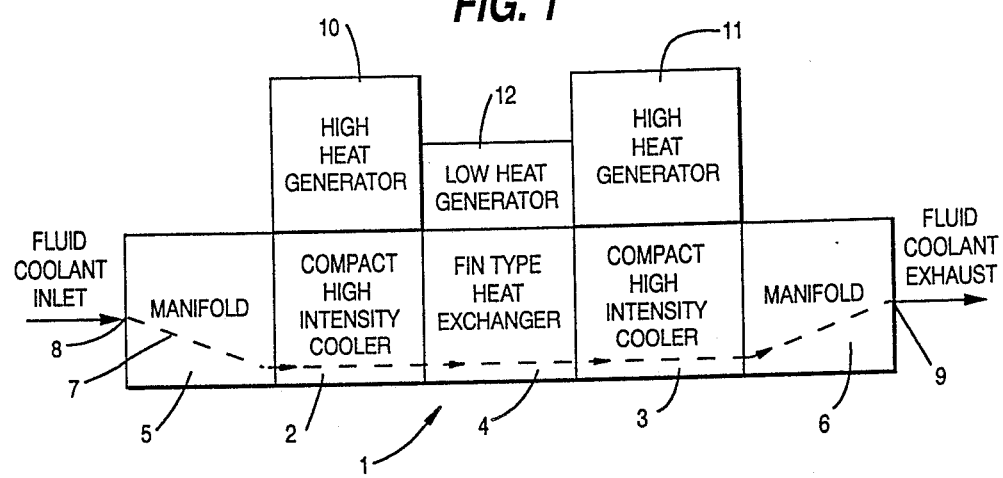
FIG. 1 is a block diagram illustrating a heat exchanger according to a first embodiment of the present invention wherein the high heat generator and the low heat generator to be cooled are located in series along a channel of the heat exchanger.

A heat exchanger 1 according to a first embodiment of the invention as shown in FIG. 1 is formed by combining compact high intensity coolers (CHIC) 2 and 3 with a fin-type heat exchanger 4. The CHIC's 2 and 3 and the fin-type heat exchanger 4 are arranged in series between inlet manifold 5 and outlet manifold 6 to define a channel 7 for a cooling fluid. The cooling fluid flows along the channel 7 from an inlet 8 in the manifold 5, through the manifold 5, CHIC 2, fin-type heat exchanger 4, CHIC 3, and manifold 6 to an outlet 9 in the manifold 6.

The compact high intensity coolers 2 and 3 each include a jet impingement cooling mechanism. Accordingly, the CHIC's 2 and 3 provide more intensive cooling than the fin-type heat exchanger 4. High heat generators 10 and 11 are located in thermal contact with the respective CHIC's 2 and 3 for effective cooling of these high heat generators. A low heat generator 12 is placed in thermal contact with the fintype heat exchanger 4 so that heat flowing from the low heat generator 12 is absorbed by the cooling fluid flowing through the channel 7 in the fin-type heat exchanger. The high heat generators 10 and 11 and the low heat generator 12 can be electrical devices such as electronic components or printed wiring boards. As a result of this specific heat exchanger 1 according to the invention, it is possible in providing cooling for electronic circuits, to solve the problem of providing dedicated cooling of a high heat flux device located in the midst of other components requiring only minimal cooling. This is accomplished with the heat exchanger 1 of the invention which employs both CHIC-type cooling and fin-type cooling in a combined structure, wherein the device is configured to selectively provide high intensity or low intensity cooling capability at various locations along its outer surface.

Figure 2:
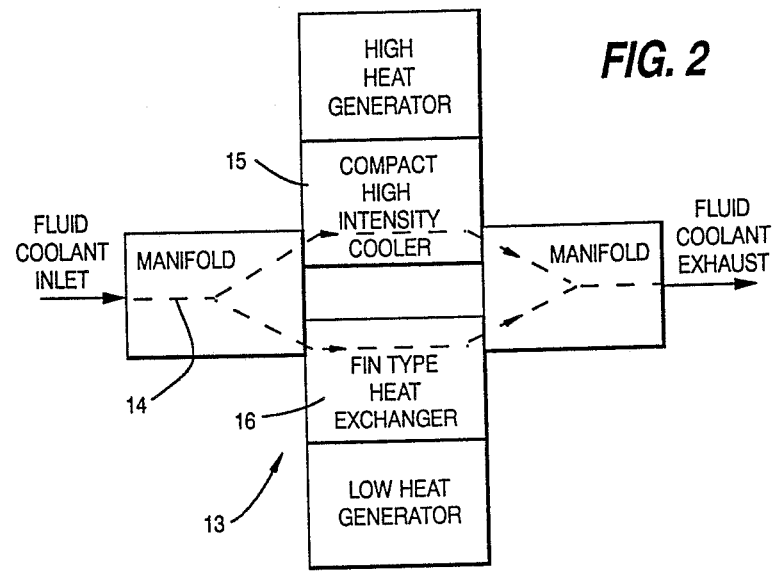
FIG. 2 is a block diagram of a heat exchanger according to a second embodiment of the invention wherein the high heat generator and the low heat generator are arranged in thermal contact with respective, parallel portions of a channel of the heat exchanger.

The heat exchanger 13 according to a second embodiment of the invention as shown in FIG. 2 is similar to the heat exchanger 1 illustrated in FIG. 1, except that the channel 14 for the cooling fluid is branched as shown in FIG. 2 so that respective portions of the cooling channel located at the CHIC 15 and fintype heat exchanger 16 are located in parallel, rather than in series as in the heat exchanger 1 of FIG. 1.

The heat exchanger 17 according to a third embodiment of the invention is illustrated in FIGS. 3-5. The heat exchanger 17 comprises a fin-type heat exchanger 18 in one plane 19 through which cooling fluid is directed until a more intensive cooling is required at a specific location. At that location, a blocking bar 20 causes the cooling fluid to move out of the plane 19 of the fin-type heat exchanger 18 and into the plane 21 of a CHIC-type heat exchanger 22, as seen in FIG. 4. After providing the more intensive cooling at the specific location, the cooling fluid is then directed back into the plane 19 of the fin-type heat exchanger 18 to continue its lower intensity cooling of components which do not require a very intensive heat removal.

More particularly, referring to FIG. 4, it is seen that the CHIC 22 and the fin-type heat exchanger 18 are arranged in fluid communication with each other. That is, a cooling fluid, see the arrows in FIG. 5, can pass through the fin-type heat exchanger 18, i.e., downward in FIG. 4, until it encounters a blocking bar 20, shown in FIG. 4. When the fluid encounters the blocking bar 20, it can no longer flow directly downward through the fin-type heat exchanger 18. However, fluid communication is provided between the fin-type heat exchanger 18 and the CHIC heat exchanger 22 by means of CHIC porting orifices 23 such that the fluid can move toward the left in FIG. 4 and into the CHIC heat exchanger 22. As the fluid then passes through the CHIC heat exchanger 22, it moves downward past the region of the blocking bar 20 to the left of the blocking bar as viewed in FIG. 4. After continuing its flow through the CHIC heat exchanger 22, the fluid then passes back into the fin-type heat exchanger 18 at a region below the blocking bar 20. From that point, it continues its flow through the remaining portions of the fin-type heat exchanger 18.

The CHIC heat exchanger 22 comprises a plurality of heat conductive jet plates 33-35 each having a number of small holes 36 through which the cooling fluid is jetted. The holes 36 in adjacent jet plates are offset from one another so that the jets of cooling fluid impinge on the adjacent plate or the inner surface of heat conductive outer member 37. The circulation of cooling fluid through heat exchanger 22 is shown by the arrows in FIG. 5. The cooling fluid is preferably a liquid, water for example.

The planar fin-type heat exchanger 18 has a general horseshoe shape as shown in FIG. 3. A cooling fluid enters the heat exchanger 18 through an inlet 24 of the heat exchanger. The inlet 24 is in the form of a circular opening at the upper left portion of the heat exchanger. The cooling fluid flows through the fin-type heat exchanger 18 in a clockwise direction until, at the 11:00 position, it encounters a first blocking bar 20 and must pass upward, up from the page of the drawing, into a CHIC heat exchanger, not shown in FIG. 3. After passing through the CHIC heat exchanger, the cooling fluid passes back down and reenters the main portion of the fin-type heat exchanger 18 where cooling continues. This occurs slightly to the left of the 12:00 location in FIG. 3. Continuing in a clockwise direction, the cooling fluid passes through the fin-type heat exchanger portion from 12:00 to 3:00 and then through another CHIC heat exchanger, not shown in FIG. 3, when it encounters another blocking bar 20 located at the 3:00 position. Eventually, the cooling fluid exits from the heat exchanger from an outlet 25 located at the 8:00 position as shown in FIG. 3. The heat exchanger fins 26 of the heat exchanger 18 are illustrated schematically in FIG. 4 and also in a portion of the cross-section of FIG. 3. However, it is understood that such heat exchanger fins also extend in the other portions of the heat exchanger 18 shown in FIG. 3 from the inlet 24 to the outlet 25.

The fin-type heat exchanger 18 is of standard brazed plate fin construction, with several additional features to force the coolant to flow through the CHIC heat exchangers. While a single CHIC heat exchanger 22 is shown in FIG. 4, it is understood that a CHIC heat exchanger is located out of the plane 19 of the heat exchanger 18 at each blocking bar 20 thereof for providing high intensity cooling at these locations. The CHIC heat exchangers 22 are attached at the external surface of the side sheet 27 of the heat exchanger 18 by welding or brazing.

The pre-brazing assembly of the heat exchanger 18 is accomplished as with standard plate fin construction. The various layers of side sheets 27, fin sections 26, edge bars 28, and blocking bars 20 are placed into a clamping/brazing fixture in the proper order. The assembly is then brazed into an inseparable unit. Post brazed welding of inlet 24 and outlet 25 porting and attachment of the CHIC heat exchangers 22 is then accomplished by welding or brazing. While the shape of the heat exchanger 18 is of horseshoe shape in the illustrated embodiment, other shapes could be employed depending upon the desired application. The CHIC heat exchangers 22 can be attached to one or both sides of the fin-type heat exchanger 18. Further, single or multiple flow channels and CHIC's can be utilized as will be readily apparent to the skilled artisan.

In operation, electrical devices such as electronic components or printed wiring boards are attached in thermal contact with the outer surfaces of respective portions of the heat exchanger 17. In particular, as shown in FIG. 5, an electrical device 30 requiring high intensity cooling is attached in thermal contact with the CHIC heat exchanger 22 and an electrical device 31 requiring low intensity cooling is attached in thermal contact with the fin-type heat exchanger 18. Cooling fluid shown schematically by the arrows 32 in FIGS. 3 and 5 is passed through the heat exchanger 17 from the inlet 24 to the outlet 25 along the channel 29 to provide selective high intensity and low intensity cooling at various locations along its outer surface thereby solving the problem of providing dedicated cooling of a high heat flux device located in the midst of other components requiring only minimal cooling.

While I have shown and described only several embodiments in accordance with the present invention, it is understood that the same is not limited thereto, but is susceptible to numerous changes and modifications as known to those skilled in the art. Therefore, I do not wish to be limited to the details shown and described herein, but intend to cover all such changes and modifications as are encompassed by the scope of the appended claims.

I claim:

1. A heat exchanger comprising thermally conductive means defining a channel having an inlet for receiving a cooling fluid and an outlet for discharging a cooling fluid to which heat has been transferred, the channel having at least two portions, one of the portions having disposed therein a jet impingement cooling mechanism comprising at least one plate having a plurality of small holes through which cooling fluid is jetted and a heat conductive member spaced from said at least one plate and upon which jets of cooling fluid exiting from said plurality of small holes impinge, and another of the portions of the channel having a non-jet impingement cooling mechanism located at said another portion of the channel for transferring heat in the non-jet impingement cooling mechanism to fluid flowing through said another portion of the channel; a first heat generator in thermal contact with the means defining the channel adjacent the one portion of the channel, heat flowing from the first generator to the one portion to cool the first heat generator during operation of the first heat generator when cooling fluid is flowing through the channel; and a second heat generator in thermal contact with the means defining the channel adjacent said another portion of the channel, heating flowing from the second generator to said another portion to cool the second heat generator during operation of the second heat generator when cooling fluid is flowing through the channel.

2. The heat exchanger according to claim 1, wherein said non-jet impingement cooling mechanism is a fin-type heat exchanger.

3. The heat exchanger according to claim 2, wherein the fin-type heat exchanger is located in one plane and said jet impingement cooling mechanism is located out of said plane.

4. The heat exchanger according to claim 2, wherein a part of said channel extends through said fin-type heat exchanger to a blocking bar which obstructs the cooling fluid flow in said fin-type heat exchanger and forces the cooling fluid to flow through at least one porting orifice of said jet impingement cooling mechanism.

5. The heat exchanger according to claim 1, wherein said jet impingement cooling mechanism is a compact high intensity cooler.

6. The heat exchanger according to claim 1, wherein said first and second heat generators are in contact with respective portions of an outer surface of said means defining a channel.

7. The heat exchanger according to claim 1, wherein said at least two portions of said channel are located in series along said channel.

8. The heat exchanger according to claim 1, wherein said at least two portions of said channel are parallel portions of said channel.

9. The heat exchanger according to claim 1, wherein said first and second heat generators are electrical devices.

10. A heat exchanger comprising thermally conductive means defining a channel having an inlet for receiving a cooling fluid and an outlet for discharging the cooling fluid to which heat has been transferred, the channel having at least two portions, one of the portions having disposed therein a jet impingement cooling mechanism for more intensive cooling, said jet impingement cooling mechanism comprising at least one plate having a plurality of small holes through which cooling fluid is jetted and a heat conductive member spaced from said at least one plate and upon which jets of cooling fluid exiting from said plurality of small holes impinge, and another of the portions of the channel having a non-jet impingement cooling mechanism located at said another portion of the channel for lower intensity cooling by transferring heat in the non-jet impingement cooling mechanism to cooling fluid flowing through said another portion of the channel.

11. The heat exchanger according to claim 10, wherein said non-jet impingement cooling mechanism is a fin-type heat exchanger.

12. The heat exchanger according to claim 11, wherein the fin-type heat exchanger is located in one plane and said jet impingement cooling mechanism is located out of said plane.

13. The heat exchanger according to claim 11, wherein a part of said channel extends through said fin-type heat exchanger to a blocking bar which obstructs cooling fluid flow in said fin-type heat exchanger and forces the cooling fluid to flow through at least one porting orifice of said jet impingement cooling mechanism.

14. The heat exchanger according to claim 10, wherein said jet impingement cooling mechanism is a compact high intensity cooler.

15. The heat exchanger according to claim 10, wherein said thermally conductive means defining a channel comprises an outer surface having surface portions adjacent the one portion of the channel and the another portion of the channel for respectively contacting a first heat generator and a second heat generator.

16. The heat exchanger according to claim 10, wherein said at least two portions of said channel are located in series along said channel.

17. The heat exchanger according to claim 10, wherein said at least two portions of said channel are located in parallel portions of said channel.

18. In an arrangement for cooling electrical devices comprising a plurality of electrical devices and means for cooling said electrical devices, the improvement comprising said means for cooling said electrical devices including a heat exchanger including thermally conductive means defining a channel having an inlet for receiving a cooling fluid and an outlet for discharging the cooling fluid to which heat has been transferred, the channel having at least two portions, one of the portions having disposed therein a jet impingement cooling mechanism comprising at least one plate having a plurality of small holes through which cooling fluid is jetted and a heat conductive member spaced from said at least one plate and upon which jets of cooling fluid exiting from said plurality of small holes impinge, and another of the portions of the channel having a non-jet impingement cooling mechanism located at said another portion of the channel for transferring heat in the non-jet impingement cooling mechanism to fluid flowing through said another portion of the channel, a first heat generating electrical device in thermal contact with the means defining the channel adjacent the one portion of the channel, heat flowing from the first heat generating electrical device to the one portion to cool the first heat generating electrical device during operation of the first heat generating electrical device when cooling fluid is flowed through the channel; and a second heat generating electrical device in thermal contact with the means defining the channel adjacent the another portion of the channel, heat flowing from the second heat generating electrical device to the another portion to cool the second heat generating electrical device during operation of the second heat generating electrical device when cooling fluid is flowing through the channel.

19. The arrangement according to claim 18, wherein said non-jet impingement cooling mechanism is a fin-type heat exchanger and said jet impingement cooling mechanism is a compact high intensity cooler.

20. The arrangement according to claim 19, wherein the fin-type heat exchanger is located in one plane and the compact high intensity cooler is located out of said plane.

* * * * *